United States Patent
Arai et al.

(10) Patent No.: US 6,275,008 B1
(45) Date of Patent: Aug. 14, 2001

(54) BATTERY CAPACITY DETECTION SYSTEM WITH TEMPERATURE CORRECTION

(75) Inventors: Youichi Arai; Tsutomu Saigo; Hideaki Kamohara, all of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/609,768

(22) Filed: Jul. 3, 2000

(30) Foreign Application Priority Data

Jul. 2, 1999 (JP) .................................................. 11-189547

(51) Int. Cl.$^7$ ..................................................... H01M 10/46
(52) U.S. Cl. ............................................. 320/132; 320/150
(58) Field of Search .................................. 320/132, 150, 320/152, 162, 164, DIG. 21

(56) References Cited

U.S. PATENT DOCUMENTS 5,592,094    1/1997    Ichikawa .
5,650,712    7/1997    Kawai et al. .
5,767,659 *  6/1998    Farley ............................... 320/150 X

FOREIGN PATENT DOCUMENTS

| | | |
|---|---|---|
| 5-161215 | 6/1993 | (JP) . |
| 8-278351 | 10/1996 | (JP) . |
| 9-154202 | 6/1997 | (JP) . |
| 10-293164 | 11/1998 | (JP) . |

* cited by examiner

*Primary Examiner*—Edward H. Tso
(74) *Attorney, Agent, or Firm*—Finnegan, Henderson, Farabow, Garrett & Dunner, L.L.P.

(57) ABSTRACT

A battery capacity detection system according to the invention is provided with: a temperature sensor for sensing a temperature of the battery; a full-charge voltage calculation section for calculating a voltage of the battery in a full charge state by using the temperature sensed by the temperature sensor; and an SOC calculation section for calculating an SOC of the battery by using the voltage of the battery in the full charge state calculated by using the temperature in the full-charge voltage calculation processing section.

7 Claims, 5 Drawing Sheets

BATTERY CAPACITY DETECTION SYSTEM WITH TEMPERATURE CORRECTION

BACKGROUND OF THE INVENTION

The present invention relates to a battery capacity detection system and, more particularly, to a battery capacity detection system with a chargeable capacity calculating function using a temperature sensor, for correcting a voltage in a full charge state by using an actually detected temperature and obtaining a chargeable capacity at the time point.

In recent years, an accurate prediction of a state of charge (SOC, also called dischargeable capacity) of a battery as a power source mounted on an electric vehicle has been being attempted.

Japanese Patent Application Laid-Open Publication No. 8-278351 discloses a battery SOC measuring apparatus.

In the battery SOC measuring apparatus, since calculation is easy, a battery controller calculates the SOC of a battery immediately after turning on an ignition by the following equation and displays the result.

$$SOC=(Vn^2-Ve^2)/(Vs^2-Ve^2)\times 100(\%)$$

where, Vn denotes an estimated voltage of the battery, Ve denotes a discharge end voltage (a fixed value) and Vs is a voltage of the battery in a fully charged state.

The voltage Vs in the fully charged state is a voltage when the battery is fully charged (substantially 100%) at the temperature of, for example, 20° C. in an initial state where degradation of the battery is not progressed yet. That is, the voltage Vs is a fixed value.

The estimated voltage Vn of the battery is obtained as follows. First, a predetermined number of values of each of a discharge current from the battery and a terminal voltage are collected and averaged. When a predetermined number of the averaged data is collected, a correlation coefficient (r) of the data is obtained. When the correlation coefficient (r) shows a strong negative correlation, a regression line (also called approximation line) is obtained by the method of least squares. From the approximation line Y (Y=aX+b) and a reference current Io, the present battery estimated voltage Vn is calculated.

The present SOC during driving is derived by the equation by using the estimated voltage Vn and the like and is properly displayed.

That is, in the battery SOC measuring apparatus, the SOC can be known without measuring the temperature.

In what is called a hybrid vehicle as well, the battery SOC measuring apparatus is used. Some battery SOC measuring apparatuses each for use in a hybrid vehicle obtain a regenerative energy to charge the battery. There is a case such that the SOC of the battery during driving is calculated, a chargeable capacity is obtained from the difference between the SOC and the SOC in the full charge state and, if it is chargeable, the battery is charged.

SUMMARY OF THE INVENTION

The inventors of the present invention have, however, examined and found that, even if the battery is in a fully charged state, the capacity tends to be calculated and displayed lower than the actual capacity when the temperature is low.

Specifically, as shown in FIG. 6, although the battery is in a fully charged state, when the temperature is low (for example, in winter), the voltage of the battery drops and the SOC characteristic is calculated and displayed lower than that at the time of high temperature (for example, in summer). Even when the electric vehicle is driven and a drive distance D becomes longer, such a state occurs.

For example, when the temperature is 20 (° C.) and the SOC is calculated as 90 (%), a chargeable state is determined and the battery is charged. When the temperature is 0 (° C.) and the SOC is 90 (%), there is a case such that the battery is already in a fully charged state.

Consequently, when it is calculated that the battery is not fully charged or the like, the battery is re-charged. At the time of low temperature, however, there is a case that the SOC is not calculated as 100 (%). In such a case, unnecessary charging is continuously performed and even a case such that it degrades the battery can be assumed.

The invention has been achieved on the basis of the above examinations and its object is to provide a battery capacity measurement apparatus with a chargeable capacity calculating function using a temperature sensor, which actually detects the temperature and can accurately calculate the chargeable capacity of the battery by using the detected temperature.

A battery capacity detection system according to the present invention comprises: a temperature sensor sensing a temperature of a battery; a full-charge voltage calculation processing section for calculating a voltage of the battery in a fully charged state by using the temperature of the battery sensed by the temperature sensor; and an SOC calculation section for calculating an SOC of the battery by using the voltage of the battery in the full-charge state calculated by using the temperature by the full-charge voltage calculation section.

DETAILED DESCRIPTION OF THE PREFERRED EMBODIMENT

An embodiment of a battery capacity detection system of the invention will be described in detail hereinbelow by properly referring to FIGS. 1 to 5.

Figure 1:
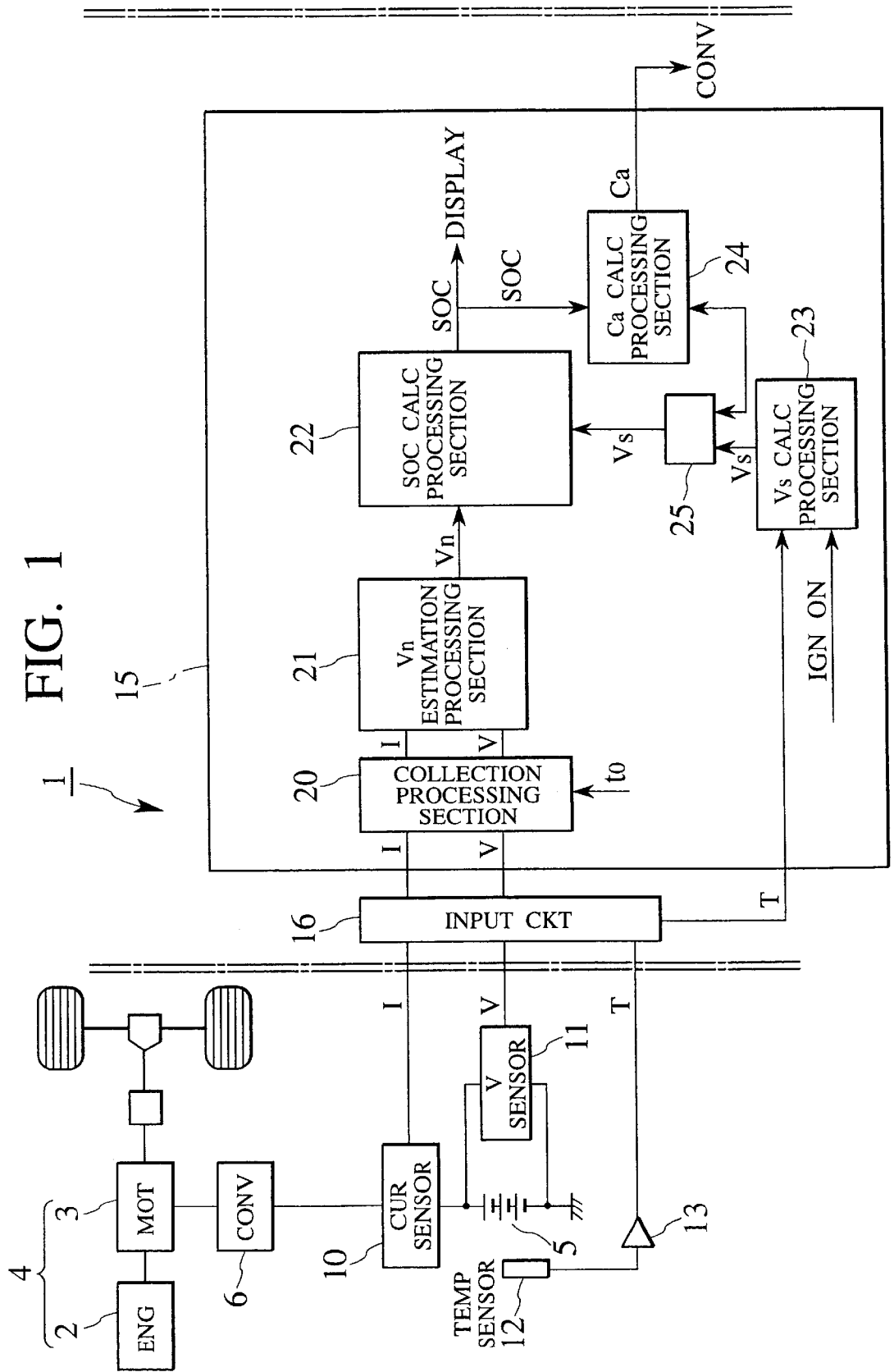
FIG. 1 is a schematic block diagram of a battery capacity detection system according to an embodiment of the present invention.

A battery controller 1 shown in FIG. 1 calculates the SOC and a chargeable capacity of a battery 5 used for a hybrid mechanism section 4 driven by an engine 2 and a motor (alternator) 3. Charging and discharging operations between the motor 3 and the battery 5 are performed via a converter 6.

A current sensor 10 is provided between the battery 5 and the converter 6.

A voltage sensor 11 is connected to the battery 5 in parallel.

Further, a temperature sensor 12 is provided near the battery 5 and the temperature of the battery 5 is sent to the battery controller 1 via a buffer 13.

According to the embodiment, the battery controller 1, current sensor 10, voltage sensor 11, temperature sensor 12, and buffer 13 constitute a battery capacity detection system.

The battery controller 1 is provided with: an input circuit 16 for performing waveform shaping on each of data signals of a detected current I from the current sensor 10, a detected voltage V from the voltage sensor 11 and temperature T from the temperature sensor 12 to thereby obtain a predetermined signal; and a battery capacity calculating section 15 for correcting the voltage Vs in the fully charged state on the basis of the temperature T and obtaining the accurate SOC and a chargeable capacity. The battery capacity calculating section 15 takes the form of a microcomputer.

As shown in FIG. 1, the battery capacity calculating section 15 comprises a collection processing section 20, a battery voltage estimation processing section 21, an SOC calculation processing section 22, a full-charge voltage calculation processing section 23, and a chargeable capacity calculation processing section 24.

The collection processing section 20 is provided between the input circuit 16 and the battery voltage estimation processing section 21 and collects data of the current I and the voltage V from the input circuit 16 for a sampling period t0 in which a voltage drop Vf caused by activation polarization and concentration polarization of the battery 5 can be ignored. That is, the data of the current I and the data of the voltage V is read only for the predetermined time t0 and is sent to the battery voltage estimation processing section 21.

The battery voltage estimation processing section 21 collects a predetermined number of values of each of the current I and the voltage V of the battery 5 and obtains averaged data by respectively averaging the predetermined number of values. When a predetermined number of the averaged data is respectively collected, the correlation coefficient (r) of the averaged data is calculated, as setting the voltage and current as coordinate axes. When the correlation coefficient (r) shows a strong negative correlation, the regression line (approximation line) of the data is obtained by the method of least squares, and the estimated voltage Vn of the present battery is calculated from the approximation line Y (Y=aX+b) and the reference current Io.

The SOC calculation processing section 22 reads the estimated voltage Vn of the battery, a preset discharge end voltage Ve and a voltage Vs in a full-charge state set by the full-charge voltage calculation processing section 23 which will be described hereinafter each time the estimated voltage Vn (or Vno) is calculated by the battery voltage estimation processing section 21. The SOC calculation processing section 22 obtains the SOC by the following equation and displays the SOC on a display (not shown).

$$SOC=(Vn^2-Ve^2)/(Vs^2-Ve^2)\times 100(\%)$$

The full-charge voltage calculation processing section 23 clears a register 25 to which the voltage Vs in the full charge state is stored upon turn-on of the ignition (IGN ON).

The section 23 reads the detected temperature T, calculates the voltage Vs in the full charge state by substituting the temperature T for a predetermined equation, and sets the obtained voltage Vs in the full charge state into the register 25.

The chargeable capacity calculation processing section 24 obtains a difference between the present SOC calculated by the SOC calculation processing section 22 and the SOC (capacity in the full charge state in which the temperature T is considered) based on the voltage Vs in the full charge state as the present chargeable capacity Ca. The chargeable capacity is sent to a charging/discharging circuit (not shown) in the converter 6 and the battery is charged.

The operation of the battery capacity detection system of the embodiment configured as mentioned above will now be described in detail.

First, the reason of performing the correction by using the temperature T and obtaining the voltage Vs in the full charge state will be explained.

Figure 2:
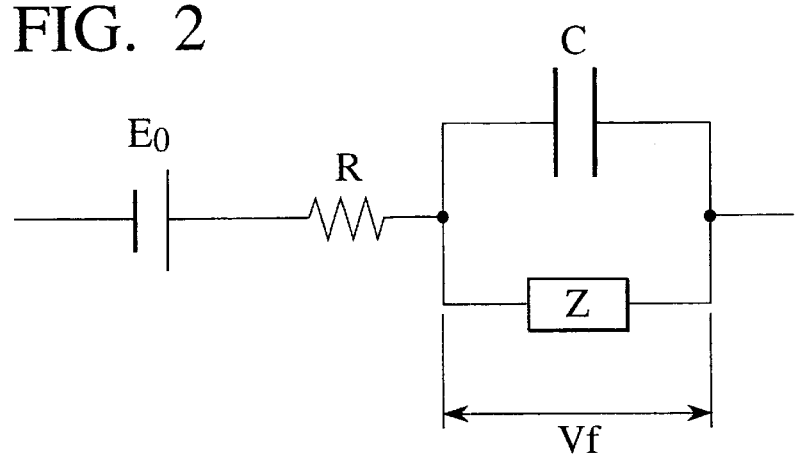
FIG. 2 is a diagram for explaining an equivalent circuit of the battery according to the embodiment.
Figure 3:
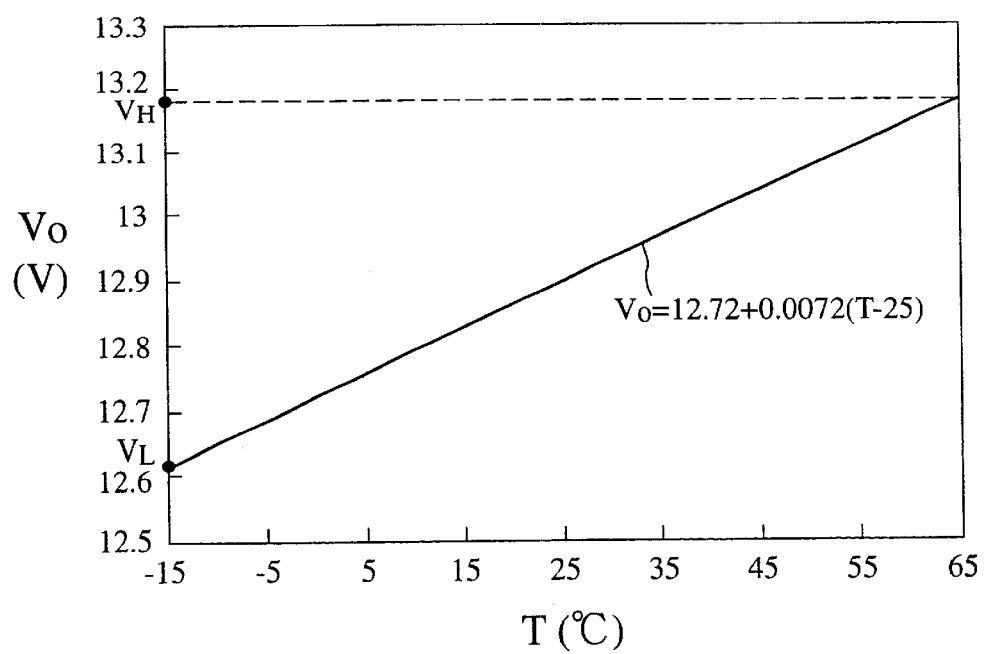
FIG. 3 is a diagram for explaining the relation between an open circuit voltage and temperature according to the embodiment.

Generally, as shown in FIG. 2, main components of the equivalent circuit of a lead battery are a power source Eo, a resister R as an ohmic resistor of fast response, a capacitor C, and an activation polarization and concentration polarization Z (parallel circuit). A terminal voltage V of the battery 5 is obtained by the following equation.

$$V=RI+Eo+Vf$$

where, Vf denotes a voltage drop due to an influence of the activation polarization and concentration polarization of which response is slower than the resistor R.

Eo is given by the following Nernst's equation.

$$Eo=2.047+(RuT/F)ln(\alpha H_2SO_4/\alpha H_2)$$

where, Ru is a gas constant ($8.206\times 10^{-5}$($m^3$. atm/K·mol)), T is a temperature (K), F is the Faraday constant ($9.6485\times 10^4$(C/mol)), $\alpha H_2SO_4$ is the activity of sulphuric acid and $\alpha H_2O$ is the activity of water.

That is, the voltage drop Vf is caused by the activation polarization and the concentration polarization. When the current I and the voltage V are sampled so as to ignore Vf, V is equal to Eo at the time of RI=0 (at the time of no load). An open circuit voltage Vo (at the time of no load) at the terminal voltage V of the battery 5 is obtained.

The terminal voltage V includes R and T components and it shows that the open circuit voltage has a temperature dependent characteristic.

For example, when it is set so that the open circuit voltage at the temperature of 1 (° C.) is +0.2 (mV/° C.·cell) and the open circuit voltage at the temperature of 25 (° C.) is 2.15 (V/cell), and the operating temperature range of the battery 5 is plus or minus 40° C. with respect to 25° C., a low temperature side open circuit voltage VL and a high temperature side open circuit voltage $V_H$ when the number of cells is 6 are as follows.

$$V_L=(2.15-40\times 0.2)\times 6=12.612 \text{ (V)}$$

$$V_H=(2.15+40\times 0.2)\times 6=13.188 \text{ (V)}$$

The relation of the temperature T and the open circuit voltage Vo is obtained as a result of the calculation. It is understood from FIG. 3 that the open circuit voltage Vo changes in accordance with a change in temperature T and is specifically expressed by the following expression.

$$Vo=12.72+0.0072 \ (T-25)$$

Consequently, it is understood that when the temperature T of the battery 5 can be detected, the open circuit voltage Vo can be accurately detected.

Further, the open circuit voltage Vo is a value at the time of no load. When RI=0, Vo=Eo. When the open circuit voltage Vo is set as the voltage Vs in the full charge state, the accurate voltage Vs in the full charge state in which the temperature T is considered can be calculated by the following equation.

$$Vs=12.72+0.0072\ (T-25)$$

Figure 4:
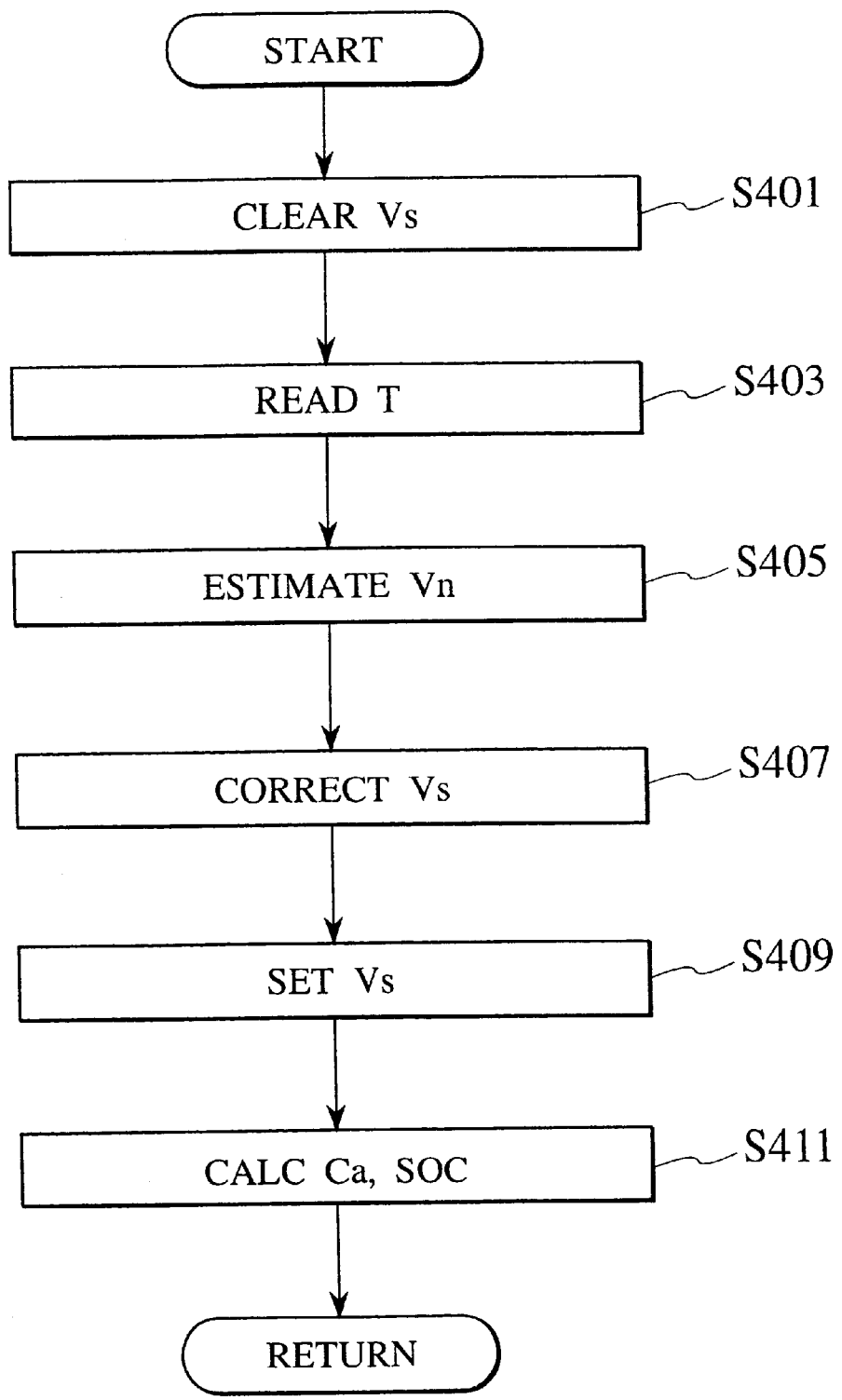
FIG. 4 is a flowchart of processes of the battery capacity detection system according to the embodiment.

The operation of the battery capacity detection system of the embodiment is shown in the flowchart of FIG. 4. A program for executing a series of processes corresponding to the flowchart is stored in a ROM (not shown) in the battery capacity calculating section 15.

First, in association with the turn-on of the ignition, the series of processes is started and the full-charge voltage calculation processing section 23 clears the register 25 in which the voltage Vs in the full charge state is set (S401).

Then, the temperature T measured by the temperature sensor 12 is read (S403).

The collection processing section 20 sends the current I and voltage V sampled for the time t0 in which Vf can be ignored to the battery voltage estimation processing section 21. The battery voltage estimation processing section 21 collects the predetermined number of values of each of the current I and voltage V and respectively averages the predetermined number of values. When the predetermined number of averaged data is respectively collected, the correlation coefficient (r) of the data is calculated. When the correlation coefficient (r) shows a strong negative correlation, the approximation line of the data is calculated by the method of least squares. From the approximation line Y (Y=aX+b) and the reference current Io, the estimated voltage Vn of the present battery is obtained (S405). That is, the estimated voltage Vn corresponding to the open circuit voltage is obtained.

The details of the calculation of the estimated voltage Vn is specifically described in Japanese Unexamined Patent Application Laid-Open Publication Nos. 8-62310 and 8-240647 and also Japanese Patent Application Nos. 11-147201 and 11-147202.

The full-charge voltage calculation processing section 23 substitutes the temperature T of the battery 5 obtained in step S403 for the following equation to thereby calculate, that is, substantially correct the voltage Vs in the full charge state (S407).

$$Vs=12.72+0.0072\ (T-25)$$

For example, when the temperature T is −10° C., T is substituted as follows.

$$Vs=12.72+0.0072\ (-10-25)$$

The full-charge voltage calculation processing section 23 sets the voltage Vs in the full charge state in which the temperature obtained in step S407 is considered into the register 25 (S409).

Subsequently, in association with the setting, the SOC calculation processing section 22 calculates the present SOC and the chargeable capacity calculation processing section 24 calculates the present chargeable capacity Ca (S411).

The SOC calculation processing section 22 calculates the SOC by the following equation by using the estimated voltage Vn of the battery 5, the preset discharge end voltage Ve and the voltage Vs in the full charge state in which the temperature T of the battery 5 is considered (S411). After that, the program is returned to the first processing step.

$$SOC=(Vn^2-Ve^2)/(Vs^2-Ve^2)\times 100(\%)$$

The chargeable capacity calculation processing section 24 calculates the difference between the present SOC calculated by the SOC calculation processing section 22 and the SOC based on the voltage Vs in the full charge state (SOC when the battery is fully charged in which the temperature T is considered) as the present chargeable capacity Ca. The chargeable capacity Ca is sent to the charging/discharging circuit (not shown) in the converter 6. When there is an allowance in the chargeable capacity Ca, the converter 6 charges the battery 5 via the charging/discharging circuit.

As described above, in the embodiment, an influence by the temperature of the battery is considered and the chargeable capacity at the temperature is calculated. Consequently, the calculated chargeable capacity becomes more accurate.

Even if the battery is charged when the temperature is low and the chargeable capacity is less than 100%, since the chargeable capacity is a reliable value, overcharge is effectively suppressed.

Figure 5:
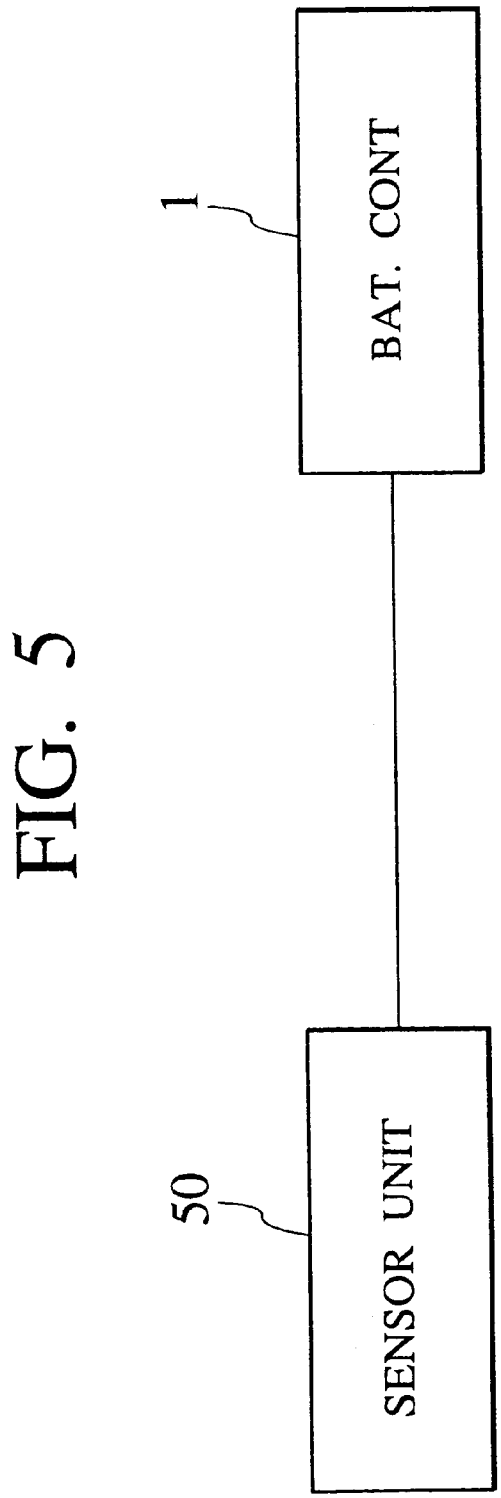
FIG. 5 is a schematic block diagram of another example of collecting temperature data.
Figure 6:
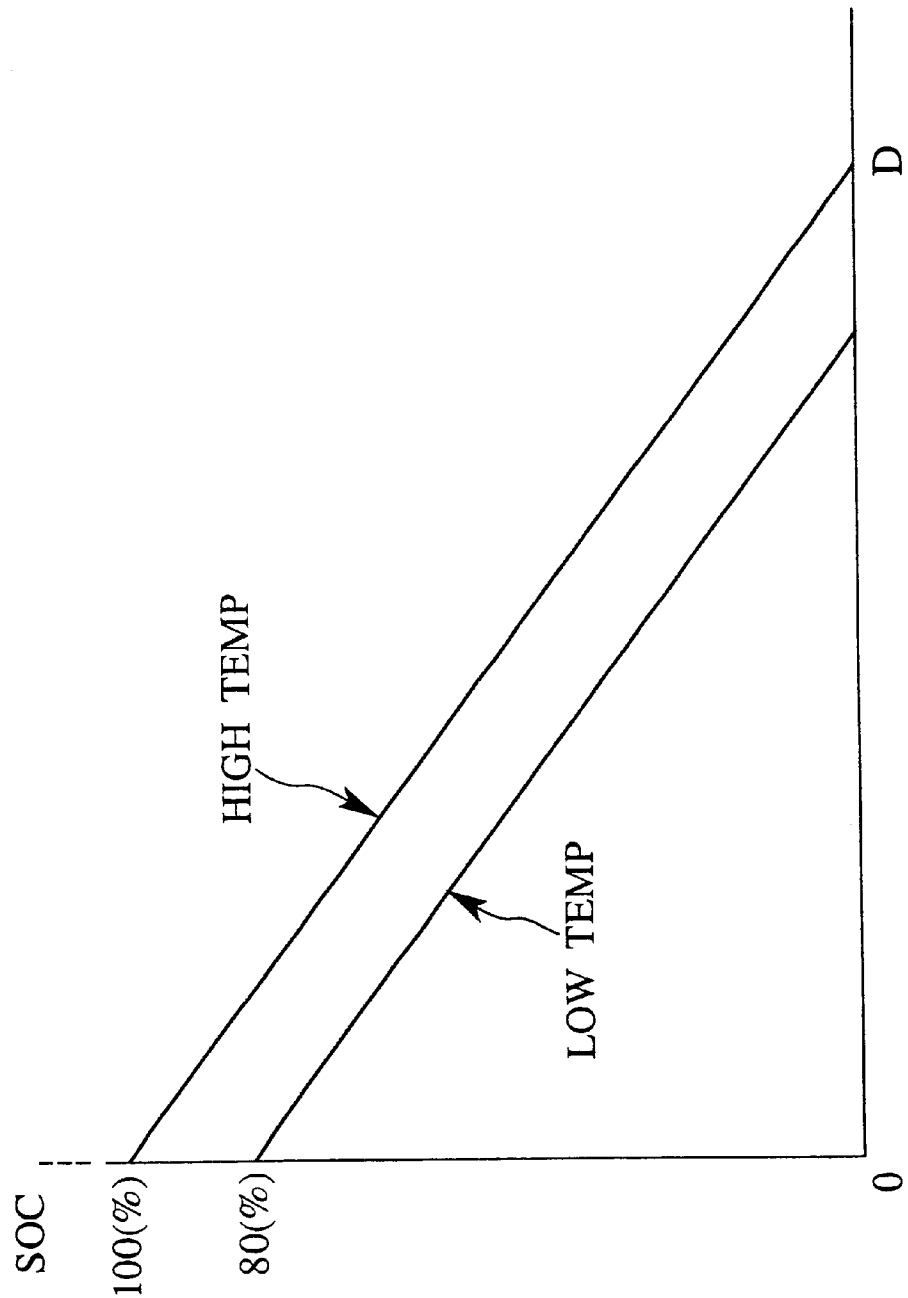
FIG. 6 is a diagram showing the temperature characteristic of the battery capacity examined by the inventors of the present invention.

Although the temperature sensor is provided near the battery 5 and the voltage in the full charge state is calculated on the basis of the temperature in the embodiment, as shown in FIG. 5, a temperature from another sensor unit for sensing a vehicle atmosphere temperature may be used by multiplexing communication (such as CAN, SAE J1850, JEVS G104).

Obviously, the invention can be variously modified without departing from the technical idea of the invention.

What is claimed is:

1. A battery capacity detection system comprising:
   a temperature sensor sensing a temperature of a battery;
   a full-charge voltage calculation processing section for calculating a voltage of the battery in a fully charged state by using the temperature of the battery sensed by the temperature sensor; and
   an SOC calculation section for calculating an SOC of the battery by using the voltage of the battery in the full charge state calculated by using the temperature by the full-charge voltage calculation section.

2. An apparatus according to claim 1, further comprising:
   a voltage sensor sensing a voltage of the battery;
   a current sensor sensing a current flowing from the battery to a load connected to the battery; and
   a battery voltage estimation section calculating an estimated voltage of the battery by estimating a voltage of the battery from both an approximation line obtained on the basis of the current and the voltage and a reference current,
   wherein the SOC calculation section calculates the SOC of the battery by further using the estimated voltage calculated by the battery voltage estimation section.

3. An apparatus according to claim 2, wherein the battery voltage estimation section collects a predetermined number of values of each of the current and the voltage, and obtains averaged data by respectively averaging the predetermined number of values,
   and wherein when a predetermined number of the averaged data is respectively collected and also the averaged data show a strong correlation, the battery voltage estimation section obtains an approximation line of the averaged data, and calculates the estimated voltage from the approximation line and the reference current.

4. An apparatus according to claim 3, wherein the SOC calculation section further calculates the SOC of the battery by further using a discharge end voltage of the battery.

5. An apparatus according to claim 1, further comprising a chargeable capacity calculation section calculating a chargeable capacity of the battery in accordance with a difference between the present SOC of the battery and the SOC of the battery calculated by using the voltage of the battery in the full charge state calculated by using the temperature.

6. An apparatus according to claim 5, wherein a load connected to the battery includes a motor and, when there is an allowance in the chargeable capacity, the battery is charged with a power from the motor.

7. An apparatus according to claim 1, further comprising a data collecting section sampling the voltage sensed by the voltage sensor and the current sensed by the current sensor for sampling time in which a voltage drop caused by polarization of the battery can be ignored.

* * * * *